United States Patent
Chen et al.

(10) Patent No.: US 9,224,815 B2
(45) Date of Patent: Dec. 29, 2015

(54) METHOD OF TUNING DOPING CONCENTRATION IN III-V COMPOUND SEMICONDUCTOR THROUGH CO-DOPING DONOR AND ACCEPTOR IMPURITIES

(71) Applicant: Taiwan Semiconductor Manufacturing Company, Ltd., Hsin-Chu (TW)

(72) Inventors: Meng-Ku Chen, New Taipei (TW); Hung-Ta Lin, Hsinhu (TW); Pang-Yen Tsai, Jhu-bei (TW); Huicheng Chang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 17 days.

(21) Appl. No.: 14/147,349

(22) Filed: Jan. 3, 2014

(65) Prior Publication Data

US 2015/0194490 A1    Jul. 9, 2015

(51) Int. Cl.
*H01L 29/10* (2006.01)
*H01L 29/66* (2006.01)
*H01L 29/78* (2006.01)

(52) U.S. Cl.
CPC ...... *H01L 29/1054* (2013.01); *H01L 29/66522* (2013.01); *H01L 29/66795* (2013.01); *H01L 29/785* (2013.01)

(58) Field of Classification Search
None
See application file for complete search history.

(56) References Cited

U.S. PATENT DOCUMENTS

| 5,930,656 A | * | 7/1999 | Furukawa et al. | 438/479 |
| 2009/0134476 A1 | | 5/2009 | Richards, Jr. | |
| 2009/0166606 A1 | * | 7/2009 | Lee | 257/13 |

OTHER PUBLICATIONS

Kim. K. S. et al., "Co-doping Characteristics of Si and Zn with Mg in P-type GaN" (1999) Materials Research Society, MRS Proceedings, vol. 595, pp. 1-6.*

* cited by examiner

*Primary Examiner* — Michael Jung
(74) *Attorney, Agent, or Firm* — Slater & Matsil, L.L.P.

(57) ABSTRACT

A method includes epitaxially growing a first III-V compound semiconductor, wherein the first III-V compound semiconductor is of p-type. The first III-V compound semiconductor is grown using precursors including a first precursor comprising Cp2Mg, and a second precursor comprising a donor impurity. A second III-V compound semiconductor is grown overlying and contacting the first III-V compound semiconductor. The second III-V compound semiconductor is of n-type.

20 Claims, 8 Drawing Sheets

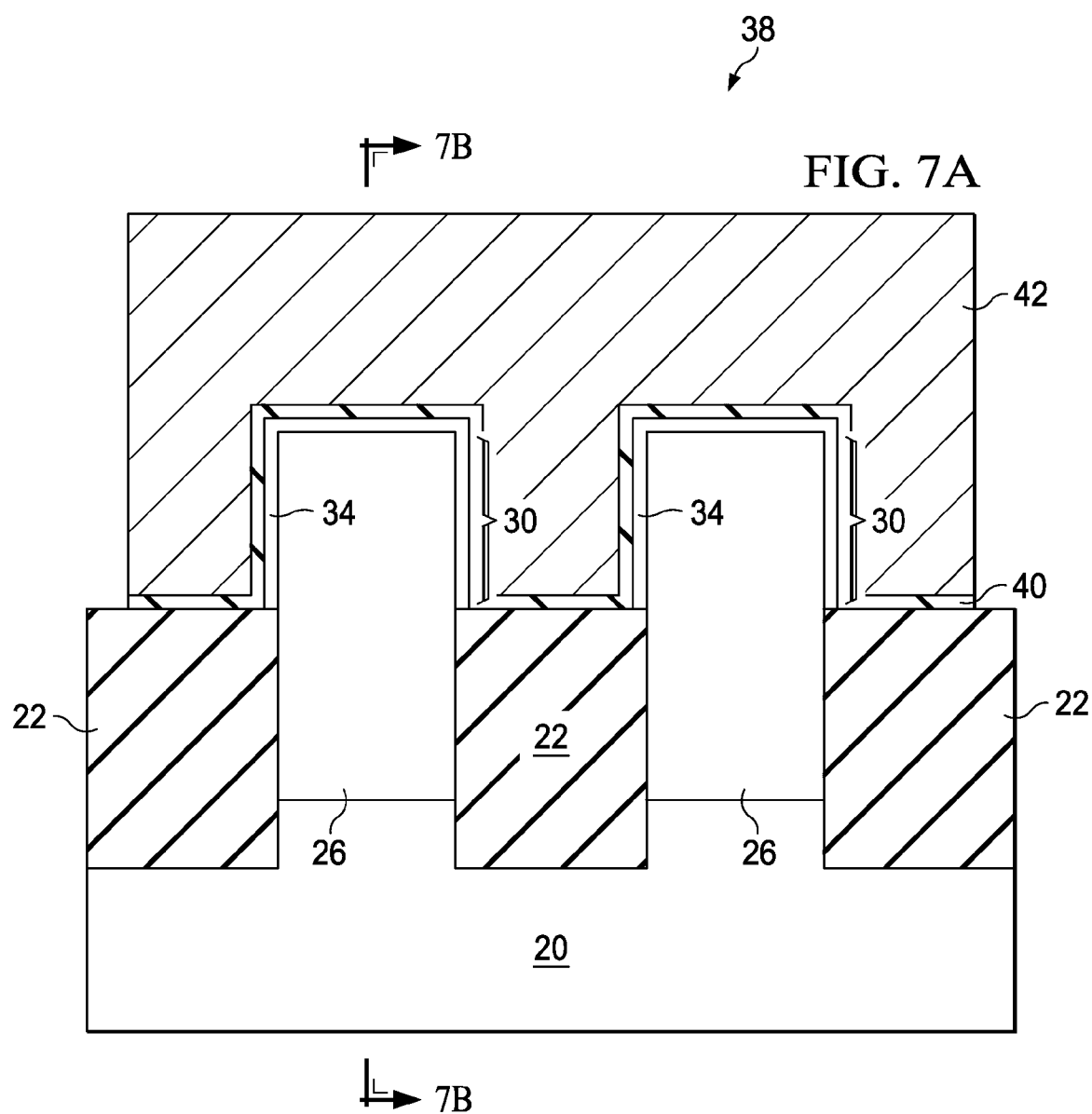

US 9,224,815 B2

METHOD OF TUNING DOPING CONCENTRATION IN III-V COMPOUND SEMICONDUCTOR THROUGH CO-DOPING DONOR AND ACCEPTOR IMPURITIES

BACKGROUND

The speed of Metal-Oxide-Semiconductor Field-Effect Transistors (MOSFETs) is closely related to the drive currents of the MOSFETs, which drive currents are further closely related to the mobility of charges. For example, NMOS FETs have high drive currents when the electron mobility in their channel regions is high, while PMOS FETs have high drive currents when the hole mobility in their channel regions is high.

Compound semiconductor materials comprising group III and group V elements (referred to as III-V compound semiconductors hereinafter) are good candidates for forming MOSFETs due to their high electron mobility. Therefore, III-V based MOSFETs have been explored recently.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 7B are cross-sectional views of intermediate stages in the formation of a Fin Field-Effect Transistor (FinFET) in accordance with some exemplary embodiments;

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A Metal-Oxide-Semiconductor Field-Effect Transistor (MOSFET) having an epitaxy III-V compound semiconductor channel, the underlying buffer region, and the method of forming the same are provided in accordance with various exemplary embodiments. The intermediate stages of forming the MOSFET and the respective channel and the buffer region are illustrated. The variations of the embodiments are discussed. Throughout the various views and illustrative embodiments, like reference numbers are used to designate like elements. An accumulation-mode Fin Field-Effect Transistor (FinFET) is used as an example to explain the concept of the embodiments. It is appreciated that the concept is readily available for the formation of other types of transistors such as planar transistors.

Figure 1:
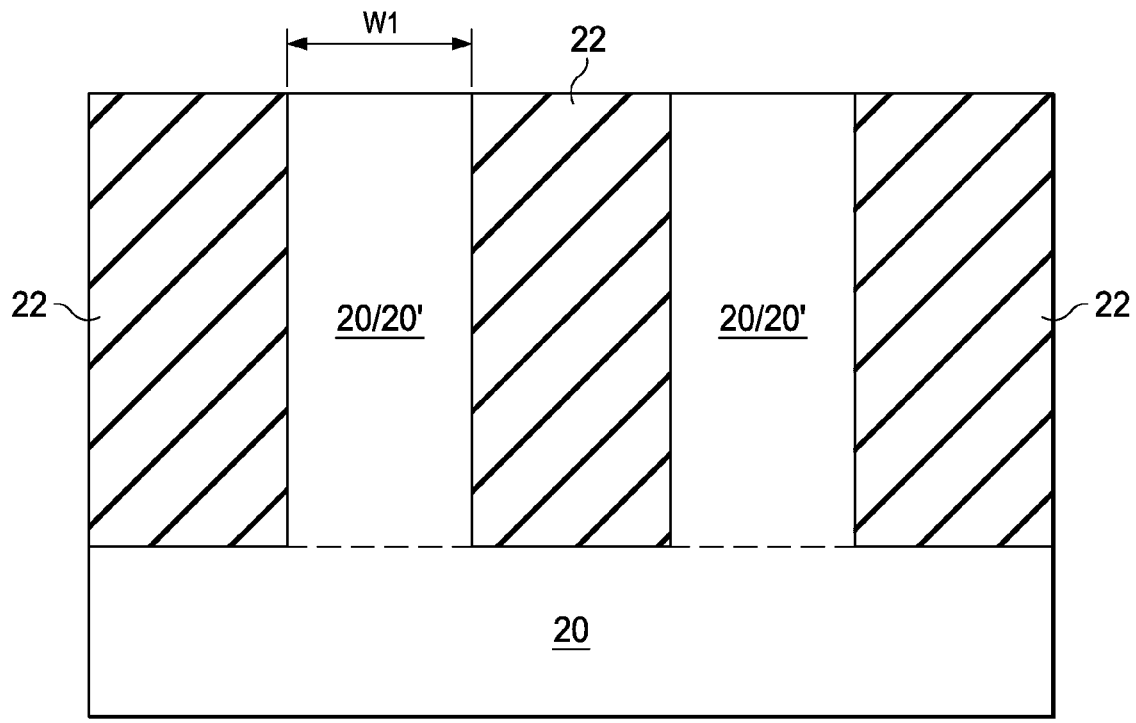

Referring to FIG. 1, substrate 20 is provided. In accordance with some embodiments, substrate 20 is a semiconductor substrate such as a crystalline silicon substrate. Substrate 20 may also include silicon, germanium, carbon, or the like. Insulation regions such as Shallow Trench Isolation (STI) regions 22 are formed in substrate 20. STI regions 22 may be formed by recessing semiconductor substrate 20 to form trenches, and then filling the trenches with dielectric materials such as silicon oxide. A Chemical Mechanical Polish (CMP) is then performed to remove excess portions of the dielectric materials, and the remaining portions of the dielectric materials are STI regions. The top surfaces of STI regions 22 are thus level with the top surface of substrate 20.

STI regions 22 include neighboring regions having their sidewalls facing each other. Portions 20' of substrate 20 extend between the neighboring STI regions. Width W1 of substrate portions 20' may be between about 10 nm and about 200 nm in some exemplary embodiments. It is appreciated that the dimensions recited throughout the description are merely examples, and may be changed to different values. The neighboring STI regions may be separate regions, or may be portions of a continuous region, which may form a STI ring in some embodiments.

Figure 2:
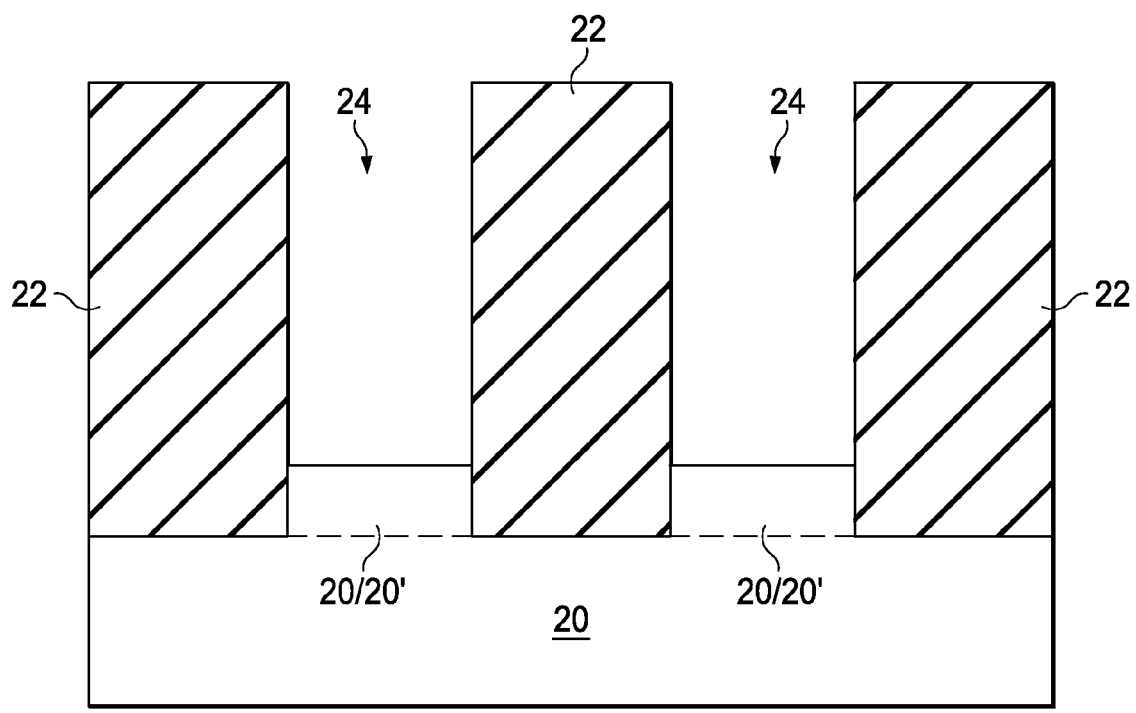

Referring to FIG. 2, substrate portions 20' are recessed, forming recesses 24 between neighboring STI regions 22. In some embodiments, the bottoms of recesses 24 are higher than the bottom surfaces of STI regions 22. In alternative embodiments, the bottoms of recesses 24 are substantially level with or lower than the bottoms of STI regions 22.

Figure 3:
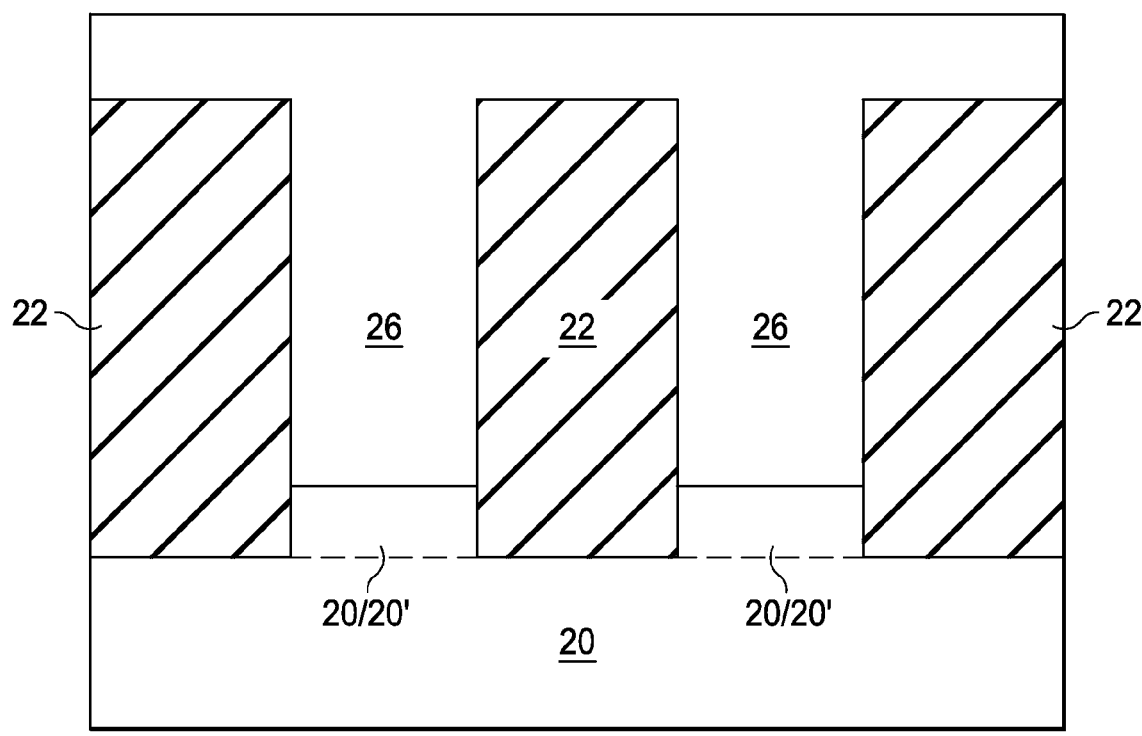

Referring to FIG. 3, III-V compound semiconductor region 26 is grown in recesses 24 through epitaxy. The epitaxy may be performed until the top surface of semiconductor region 26 is higher than the top surfaces of STI regions 22. Throughout the description, III-V compound semiconductor region 26 is also referred to as a buffer region or a body region, on which a channel of the respective FinFET is formed. In some embodiment, III-V compound semiconductor region 26 comprises an In-V compound semiconductor, which comprises indium and a group-V element. For example, III-V compound semiconductor region 26 may comprise GaAs, GaP, InP, InAlAs, or multi-layers thereof.

The formation of III-V compound semiconductor region 26 may be performed using Metal-Organic Chemical Vapor Deposition (MOCVD). The respective precursors may include carbon and/or oxygen containing precursors such as Trimethylgallium (TMGa), Triethylgallium (TEGa), Trimethylindium (TMIn), Triethylaluminium (TMAl), Tertiarybutyl arsine (TBAs), and Tertiarybutyl phosphine (TBP), or the like. As a result, carbon and/or oxygen are unintentionally doped in III-V compound semiconductor region 26, resulting in III-V compound semiconductor region 26 to exhibit n-type background doping when no p-type or n-type impurity is added intentionally. In accordance with the embodiments of the present disclosure, III-V compound semiconductor region 26 is to be formed as a p-type region. Accordingly, during the epitaxy, bis cyclopentadienyl magnesium (Cp2Mg, with the chemical formula being $(C_5H_5)_2Mg$) is in-situ added as the p-type impurity to counter the n-type background doping, so that the resulting III-V compound semiconductor region 26 is of p-type.

Figure 9:
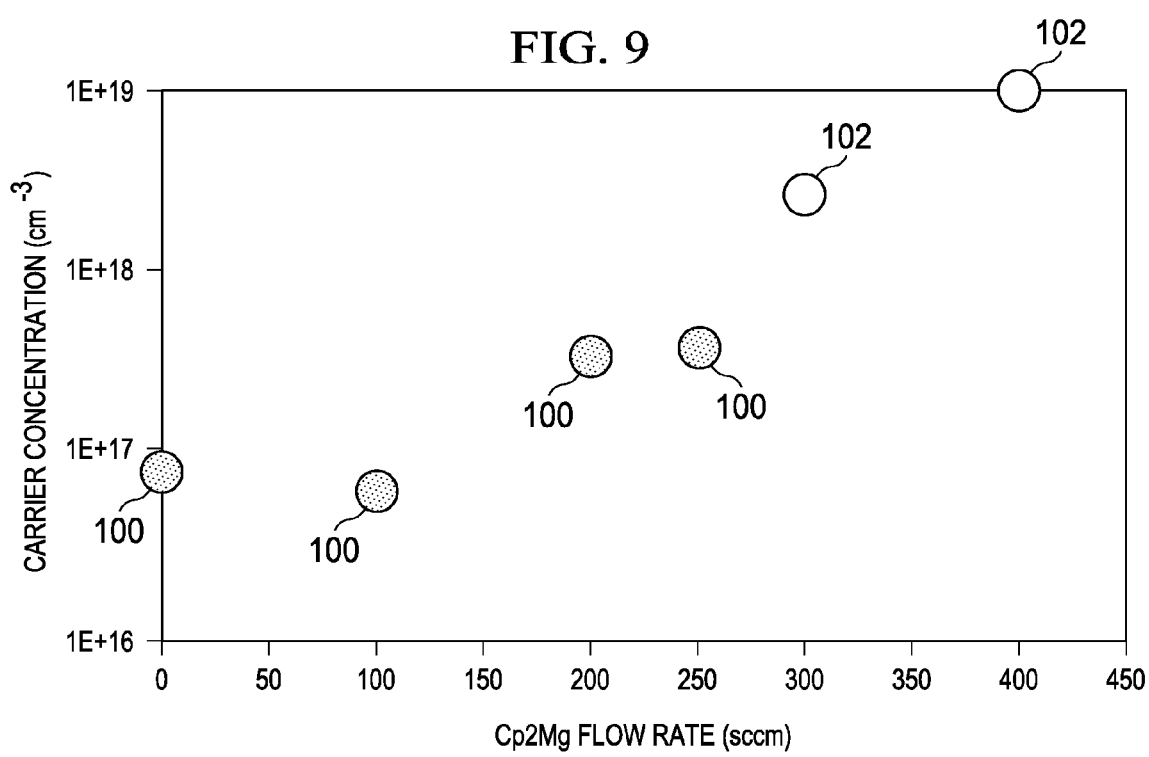
FIGS. 9 and 10 illustrate carrier concentrations as functions of the flow rate of Cp2Mg during the epitaxy of In-V compound semiconductor regions in accordance with some experiments.

FIG. 9 illustrates the net carrier (electrons or holes) concentration in III-V compound semiconductor region 26, wherein the net carrier concentration is illustrated as a function of the flow rate of Cp2Mg in accordance with some experiments. Solid circles 100 represent that the respective net carriers are electrons, and hence the respective III-V compound semiconductor region 26 is of n-type. Hollow circles 102 represent that the respective net carriers are holes, and hence the respective III-V compound semiconductor region 26 is of p-type. In the experiments as shown in FIG. 9, the epitaxially grown III-V compound semiconductor regions 26 are InAlAs regions.

As illustrated in FIG. 9, with the increase in the flow rate of Cp2Mg from 0 sccm to about 250 sccm, the n-type carriers (electrons) in the epitaxy InAlAs regions have a general trend of increasing in concentration, for example, from about 8E+16/cm$^3$ to about 4E+17/cm$^3$. With the further increase in the flow rate of Cp2Mg to about 300 sccm, the carrier type is changed to p-type. At the flow rate of 300 sccm, the p-type carrier concentration is already equal to about 2.7E+18/cm$^3$. The transition from n-type to high-concentration p-type occurs in the small flow-rate region of 250 sccm to 300 sccm. Therefore, it is difficult to find a suitable flow rate of Cp2Mg that results in a low p-type impurity concentration in III-V compound semiconductor region 26, which low p-type impurity concentration may be, for example, lower than about 1E18/cm$^3$ or even lower than about 1E17/cm$^3$.

Figure 10:
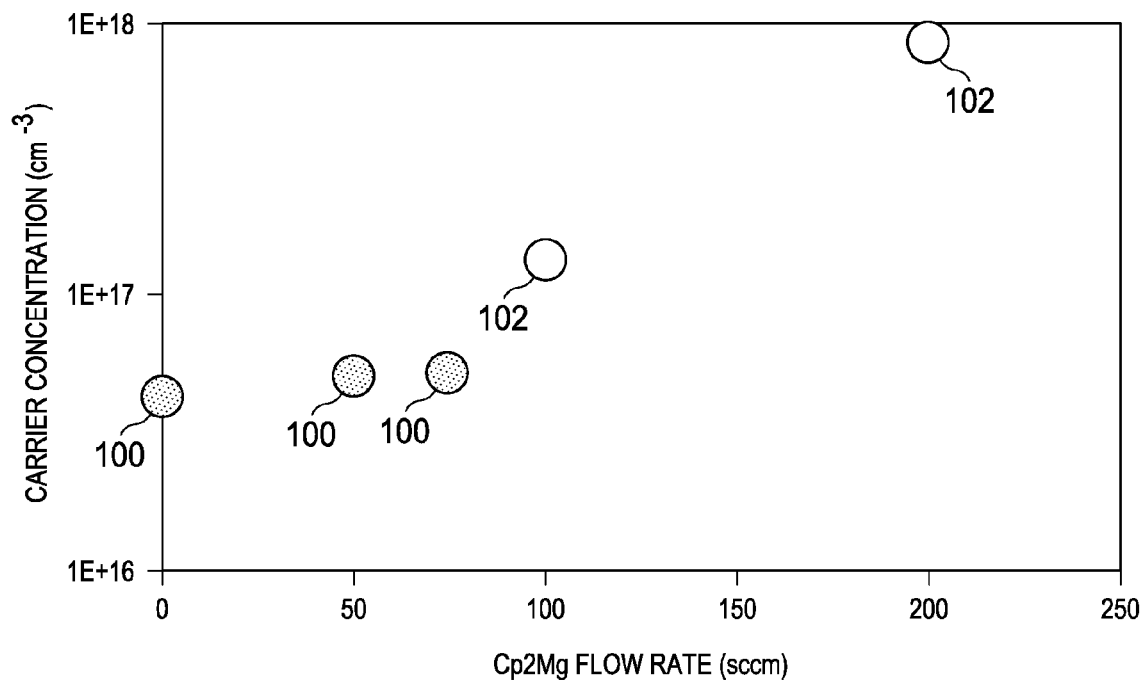

FIG. 10 illustrates another graph showing the (electrons or holes) concentration as a function of the flow rate of Cp2Mg during the epitaxy in accordance with some experiments. FIG. 10 is similar to FIG. 9, except that in FIG. 10, InP (rather than InAlAs) is grown to form III-V compound semiconductor region 26. FIG. 10 illustrates that the similar phenomenon occurs to InP, wherein the transition from n-type to high-concentration p-type occurs when the flow rate of Cp2Mg increases from 75 sccm to 100 sccm. Hence, it is difficult to find a suitable flow rate of Cp2Mg, which results in a low p-type impurity concentration region in III-V compound semiconductor region 26.

In accordance with the embodiments of the present disclosure, to solve the problems shown in FIGS. 9 and 10, an additional donor impurity (n-type) is added during the epitaxy of III-V compound semiconductor region 26. Throughout the description, the term "donor impurity" refers to the impurity that, when added, provide electrons to the respective III-V compound semiconductor region 26 and makes it to turn toward n type. The donor impurity counters the acceptor impurity magnesium, and causes the reduction in the net p-type carrier concentration in III-V compound semiconductor region 26. Hence, in the embodiments of the present disclosure, the donor impurity and magnesium (in Cp2Mg) are co-doped simultaneously when the epitaxy (FIG. 3) of III-V compound semiconductor region 26 proceeds. In accordance with some embodiments, the added donor impurity includes a group IV element such as silicon. In alternative embodiments, other group IV elements such as germanium or tin may be co-doped with Cp2Mg. In yet alternative embodiments, group VI elements such as selenium and tellurium may be co-doped with Cp2Mg. Accordingly, the precursors for epitaxially growing III-V compound semiconductor region 26 may include the precursors for adding the donor elements such as silicon, germanium, selenium, tellurium, or the like. For example, when silicon is to be co-doped, the silicon-containing precursors such as SiH$_4$, Si$_2$H$_6$, or combinations thereof, may be included in the precursor in addition to Cp2Mg. Similarly, when germanium is to be co-doped, the germanium-containing precursors such as GeH$_4$, Ge$_2$H$_6$, or combinations thereof, may be included in the precursor in addition to Cp2Mg.

Figure 11:
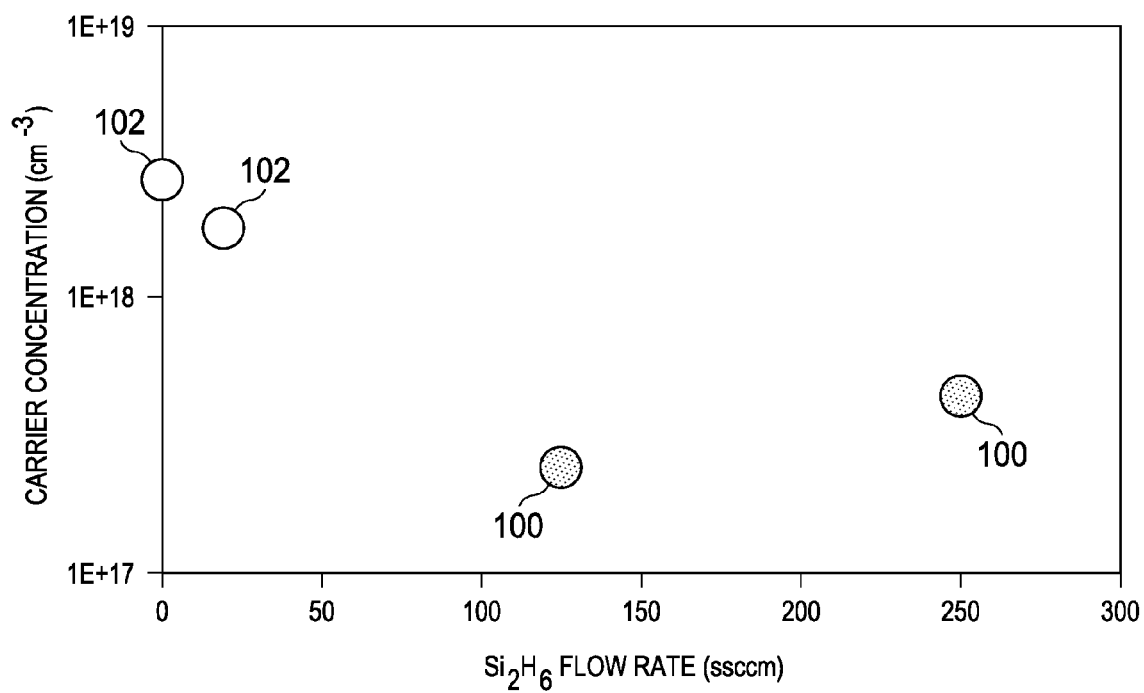
FIG. 11 illustrates the carrier concentration as functions of the flow rate of $Si_2H_6$ during the epitaxy of In-V compound semiconductor regions in accordance with some experiments.

The effect of the co-doping is shown in FIG. 11, which illustrates the carrier concentration as a function of the flow rate of Si$_2$H$_6$ during the epitaxy in accordance with some experiments. In the experiments, the flow rate of Cp2Mg is maintained at 300 sccm, and the flow rate of Si$_2$H$_6$ is adjusted, and the resulting carrier concentration is measured. Again, solid circles 100 represent that the respective net carriers are electrons, and hence the respective III-V compound semiconductor region 26 is of n-type. Hollow circles 102 represent that the respective net carriers are holes, and hence the respective III-V compound semiconductor region 26 is of p-type. As shown in FIG. 11, with the increase in the flow rate of Si$_2$H$_6$ from 0 sccm to 20 sccm, the p-type carrier concentration in III-V compound semiconductor region 26 is reduced from about 2.7E+18 /cm$^3$ to about 1.8E+18 /cm$^3$. Although not shown, when the flow rate of Si$_2$H$_6$ is further increased in the range between about 20 sccm to about 100 sccm, for example, the p-type carrier concentration in III-V compound semiconductor region 26 can further be reduced. Therefore, with the donor impurity being co-doped, the p-type carrier concentration in III-V compound semiconductor region 26 can be fine-tuned to smaller values.

In accordance with the embodiments of the present disclosure, in the epitaxy of III-V compound semiconductor region 26 (FIG. 3), the Cp2Mg has a flow rate in the range between about 50 sccm and about 400 sccm. The precursor comprising the donor impurity has a flow rate between about 100 sccm and about 500 sccm if TMIn or TMAl is used, or between about 300 sccm and about 1,500 sccm if TBAs is used. The resulting III-V compound semiconductor region 26, which is of p-type, may reach a net p-type impurity concentration in the order of 1E17/cm$^3$ or lower. The optimum flow rates of the co-doping precursors may be found through experiments.

Figure 4:
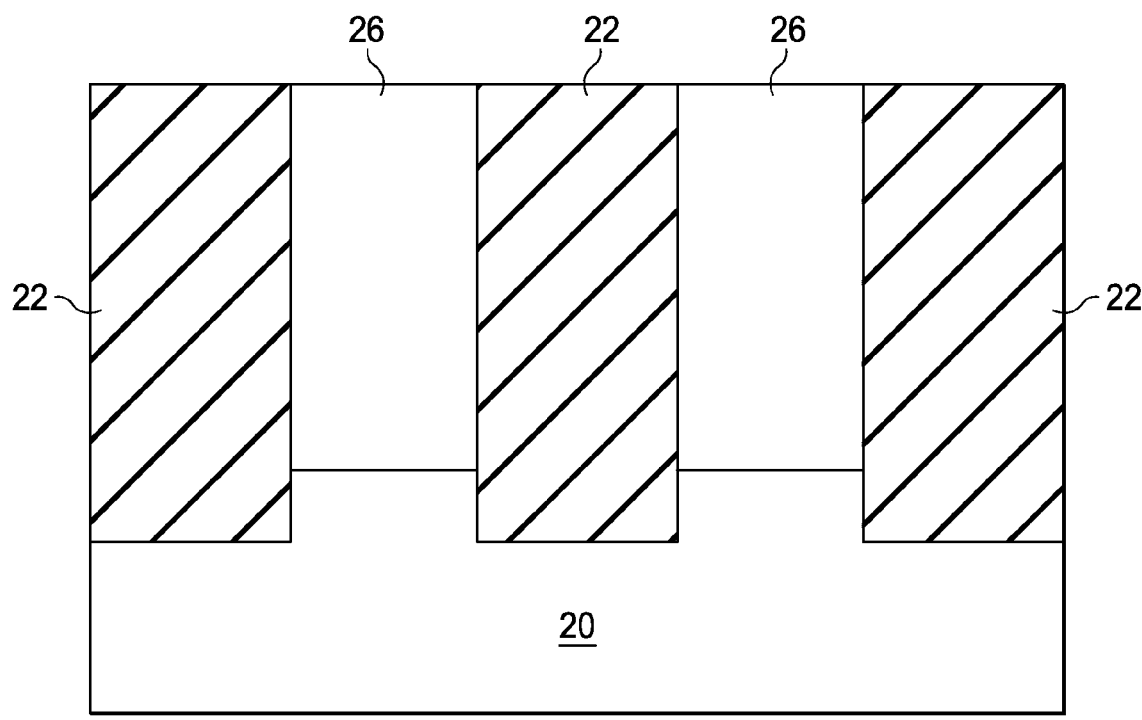

Next, referring to FIG. 4, a planarization such as a Chemical Mechanical Polish (CMP) is performed, so that the top surface of the resulting III-V compound semiconductor region 26 is substantially level with the top surfaces of STI regions 22.

Figure 5:
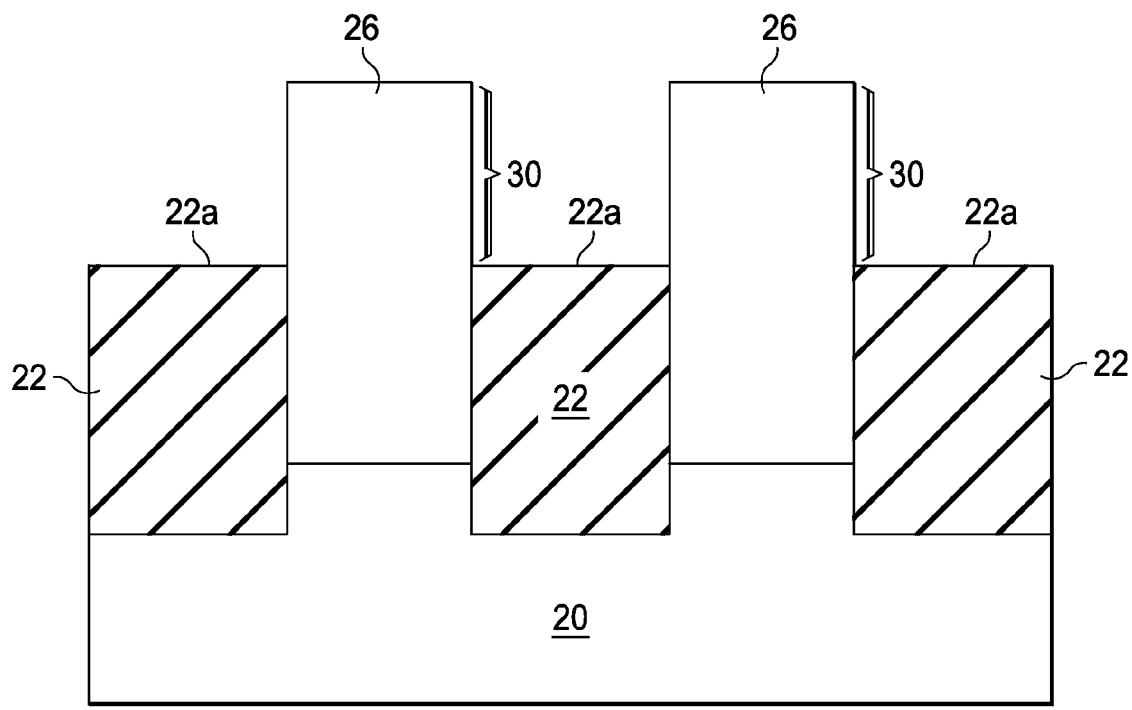

Referring to FIG. 5, STI regions 22 are recessed, for example, through an etching step. The portions of III-V compound semiconductor region 26 that are higher than top surfaces 22A of STI regions 22 are referred to as semiconductor fins 30 hereinafter.

Figure 6A:
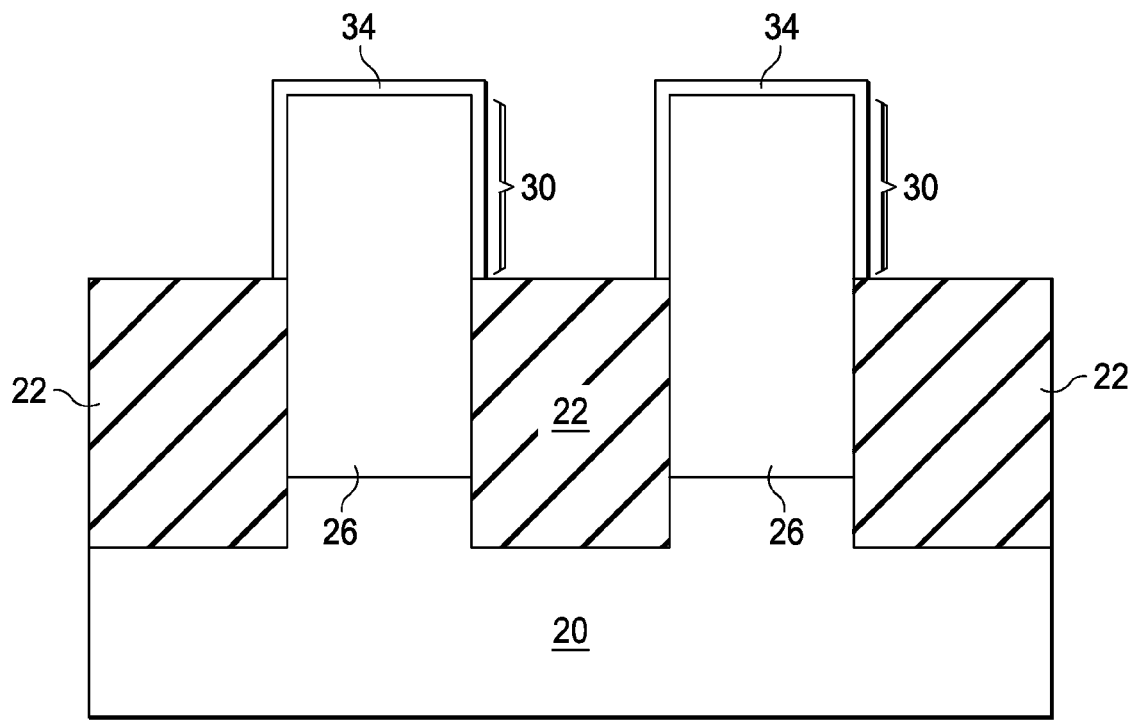

FIG. 6A illustrates the formation of semiconductor layers 34, which are epitaxially grown on the exposed top surfaces and sidewalls of semiconductor fins 30. Semiconductor layers 34 may be conformal layers, with the portions on the top surfaces of semiconductor fins 30 having substantially the same thickness as the portions on the sidewalls of semiconductor fins 30. In some embodiments, the thickness of semiconductor layers 34 is between about 3 nm and about 15 nm.

Semiconductor layers 34 may be III-V compound semiconductor layers, and hence are referred to as III-V compound semiconductor layers 34 hereinafter. In some embodiments, III-V compound semiconductor layers 34 comprise an In-V compound semiconductor material such as InGaAs. The formation of III-V compound semiconductor layers 34 also includes an epitaxy, which may be performed using MOCVD, for example. III-V compound semiconductor layers 34 are of n-type, which may be unintentionally doped or intentionally doped. In some embodiments, during the epitaxy of III-V compound semiconductor layers 34, no Cp2Mg is included in the precursors used in the epitaxy. Furthermore, no precursor that includes the donor impurity is included in the epitaxy. For example, the candidate precursors (which contains a donor impurity) for forming III-V compound semiconductor region 26 are not used in the epitaxy of III-V compound semiconductor layers 34. In alternative embodiments, one, but not both, of Cp2Mg and a donor impurity-containing precursor is included in the precursors to adjust the n-type carrier concentration in III-V compound semiconductor layers 34. In some exemplary embodiments, the net n-type carrier concentration in III-V compound semiconductor layers 34 is in the range between about 1E17/cm³ and about 1E20/cm³.

In alternative embodiments, III-V compound semiconductor layers 34 may be formed before the recessing of STI regions 22 and in recess 24 (FIG. 2). Accordingly, after the CMP, III-V compound semiconductor layers 34 remain in the recess, and have a top surface level with the top surfaces of STI regions 22. The resulting structure after the recessing of STI regions 22 is similar to what is shown in FIG. 6A, except that III-V compound semiconductor layers 34 are on the top surfaces of, and are co-terminal with, semiconductor fins 30. In these embodiments, III-V compound semiconductor layers 34 do not extend on the sidewalls of semiconductor fins 30. The resulting structure is shown in FIG. 6B.

Figure 6B:
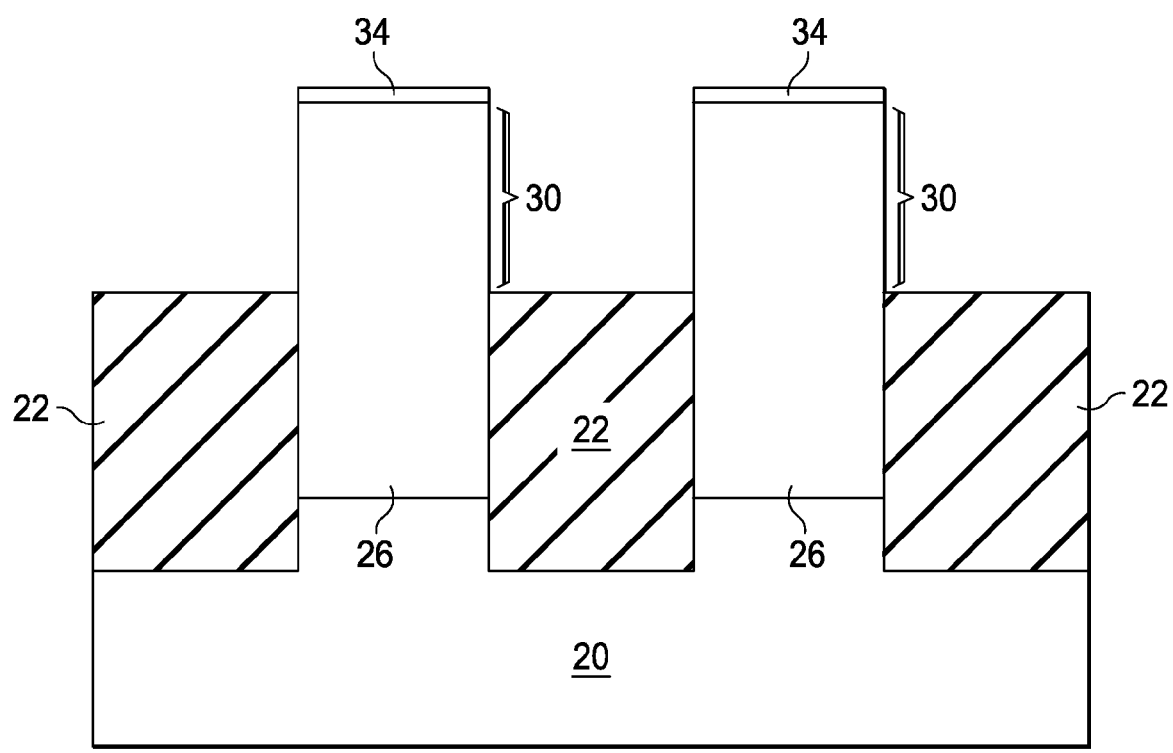
Figure 7B:
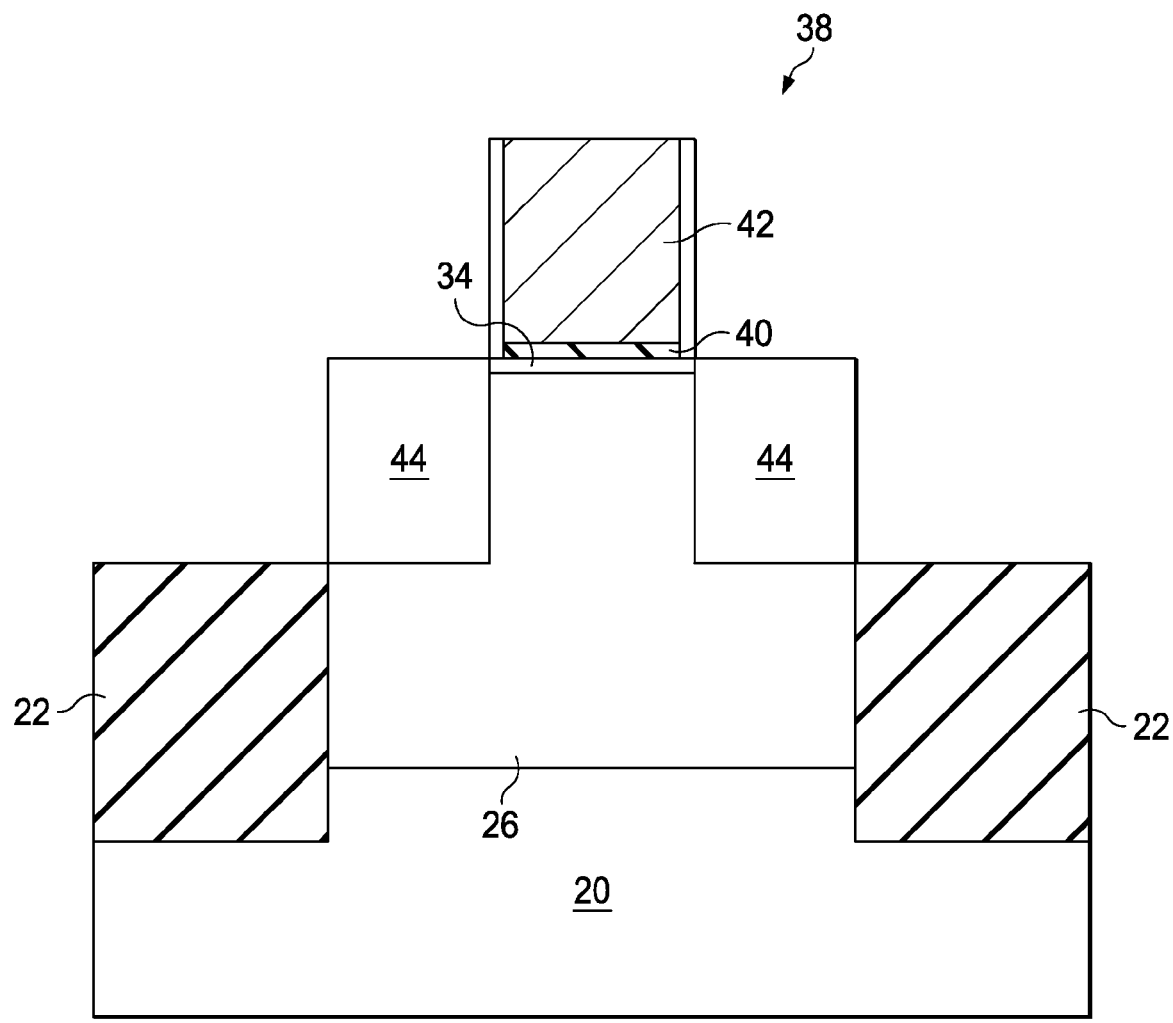

The structure shown in FIGS. 6A and 6B may be used to form FinFET 38, as shown in FIGS. 7A and 7B, wherein FIG. 7B is a cross-sectional view obtained from the plane crossing line-7B-7B in FIG. 7A. Referring to FIG. 7A, gate dielectric 40 and gate electrode 42 are formed. Gate dielectric 40 may be formed of a dielectric material such as silicon oxide, silicon nitride, an oxynitride, multi-layers thereof, and/or combinations thereof. Gate dielectric 40 may also comprise a high-k dielectric material. The exemplary high-k materials may have k values greater than about 4.0, or greater than about 7.0. Gate electrode 42 may be formed of doped polysilicon, a metal or metal alloy, a metal nitride, a metal silicide, or the like. The bottom ends of gate dielectric 40 may contact the top surfaces of STI regions 22 in some embodiments.

After the formation of gate dielectric 40 and gate electrode 42, source and drain regions 44 (FIG. 7B) are formed. Source and drain regions 44 are heavily doped n-type regions, which may have n-type carriers with a concentration higher than about 1E+19/cm³, for example, although lower concentrations may also be used. FinFET 38 may be an accumulation-mode FET device, which has the n-type channel formed of III-V compound semiconductor layers 34, and p-type buffer (body) 26 underlying the n-type channel. With source and drain regions 44 and channel 34 being all of n-type, FinFET 38 is normally on, and is turned off when channel 34 is depleted. Since p-type buffer (body) 26 also acts as a well region, its p-type carrier concentration is preferably low, which is achieved through the co-doping.

Figure 8:
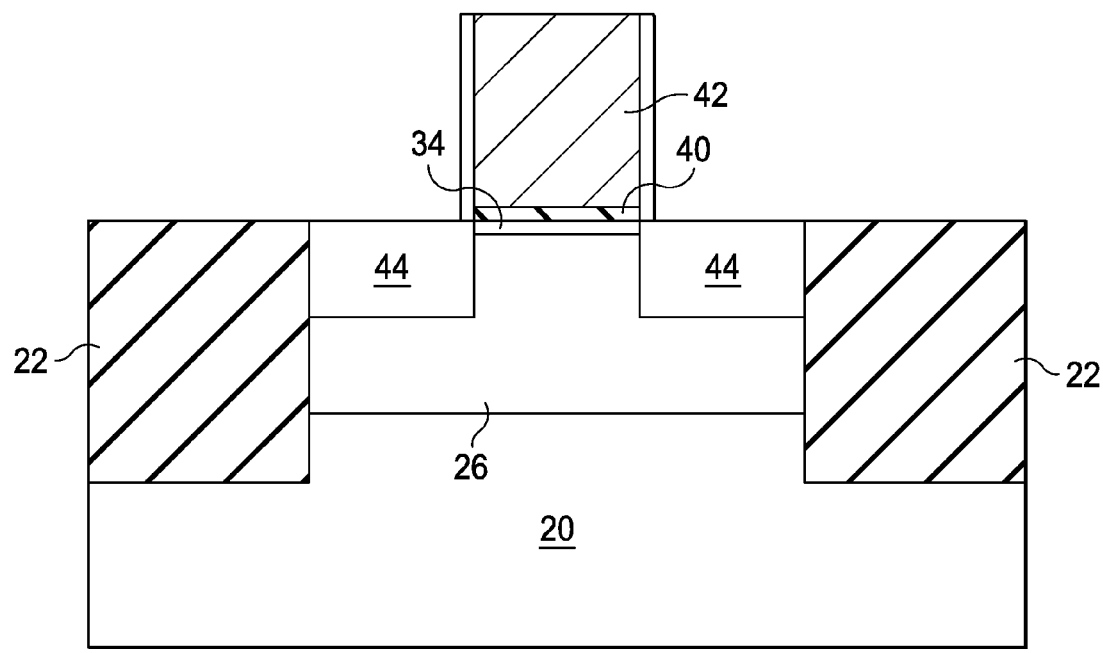
FIG. 8 illustrates the cross-sectional view of a planar Field-Effect Transistor (FET) in accordance with some alternative exemplary embodiments.

The device shown in FIGS. 7A and 7B is a FinFET. The concept of the present disclosure may also be used for forming other In-V compound semiconductor materials having low p-type carrier concentrations, which may further be used for forming other types of FET devices. For example, FIG. 8 illustrates a planar transistor 46, which also includes n-type III-V compound semiconductor region 26 and p-type channel 34, which are formed using same materials and process conditions as in the embodiments shown in FIGS. 1 through 7B. One of ordinary skill in the art will realize the details for forming planar transistor 46 by referring to the embodiments shown in FIGS. 1 through 7B.

The embodiments of the present disclosure have some advantageous features. By using Cp2Mg as a precursor for adding the p-type impurity, the unintentionally doped n-type III-V compound semiconductor regions may be counter doped as p-type regions. However, there is a process difficulty in achieving low p-type carrier concentration in the III-V compound semiconductor regions when Cp2Mg is used. In the embodiments of the present disclosure, the process difficulty is solved by co-doping an additional precursor to add an n-type impurity (donor impurity). The p-type carrier concentration may be adjusted by fixing the flow rate of Cp2Mg, and adjusting the flow rate of the precursor of the n-type impurity to achieve the desirable low p-type carrier concentration.

In accordance with some embodiments, a method includes epitaxially growing a first III-V compound semiconductor, wherein the first III-V compound semiconductor is of p-type. The first III-V compound semiconductor is grown using precursors including a first precursor comprising Cp2Mg, and a second precursor comprising a donor impurity. A second III-V compound semiconductor is grown overlying and contacting the first III-V compound semiconductor. The second III-V compound semiconductor is of n-type.

In accordance with other embodiments, a method includes epitaxially growing a first In-V compound semiconductor, wherein during the growing the first In-V compound semiconductor, magnesium and a donor impurity is in-situ co-doped. A second In-V compound semiconductor is grown overlying and contacting the first In-V compound semiconductor. During the growing the second In-V compound semiconductor, neither of the magnesium and the donor impurity is doped. The method further includes forming a gate dielectric over the second In-V compound semiconductor, forming a gate electrode over the gate dielectric, and forming a source region and a drain region on opposite ends of the second In-V compound semiconductor. The source region and the drain region are of n-type.

In accordance with yet other embodiments, an integrated circuit device includes a first In-V compound semiconductor comprising magnesium and an impurity selected from the group consisting essentially of silicon, germanium, selenium, tellurium, and combinations thereof, wherein the first In-V compound semiconductor is of p-type. The integrated circuit device further includes a second In-V compound semiconductor overlying and contacting the first In-V compound semiconductor. The second In-V compound semiconductor is free from magnesium, and wherein the second In-V compound semiconductor is of n-type.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   epitaxially growing a first III-V compound semiconductor, wherein the first III-V compound semiconductor is of p-type, and is grown by simultaneously using precursors comprising:
   first precursors comprising a group III element and a group V element;
   a second precursor comprising bis cyclopentadienyl magnesium (Cp2Mg); and a third precursor comprising a donor impurity selected from germanium, tin, selenium, and tellurium.

2. The method of claim 1, wherein the third precursor comprises silicon, germanium, tin, selenium, or tellurium.

3. The method of claim 1 further comprising:
epitaxially growing a second III-V compound semiconductor overlying and contacting the first III-V compound semiconductor, wherein the second III-V compound semiconductor is of n-type;
forming a gate dielectric over the second III-V compound semiconductor;
forming a gate electrode over the gate dielectric; and
forming a source region and a drain region connected to opposite ends of the second IIIV compound semiconductor, wherein the source region and the drain region are of n-type.

4. The method of claim 3 further comprising:
forming Shallow Trench Isolation (STI) regions in a semiconductor substrate;
removing a portion of the semiconductor substrate between two opposite portions of the STI regions to form a recess, wherein the first III-V compound semiconductor is grown in the recess; and
recessing the STI regions, wherein a portion of the first III-V compound semiconductor over the STI regions forms a fin, and wherein the second III-V compound semiconductor is grown on the fin.

5. A method comprising:
epitaxially growing a first In-V compound semiconductor, wherein during the growing the first In-V compound semiconductor, magnesium and a donor impurity are in-situ codoped;
epitaxially growing a second In-V compound semiconductor overlying and contacting the first In-V compound semiconductor, wherein during the growing the second In-V compound semiconductor, neither the magnesium nor the donor impurity is doped;
forming a gate dielectric over the second In-V compound semiconductor;
forming a gate electrode over the gate dielectric; and
forming a source region and a drain region on opposite ends of the second In-V compound semiconductor, wherein the source region and the drain region are of n-type.

6. The method of claim 5, wherein the first In-V compound semiconductor is of p-type, and the second In-V compound semiconductor is of n-type.

7. The method of claim 5, wherein the first In-V compound semiconductor is selected from the group consisting essentially of InP, InAlAs, and combinations thereof, and wherein the second In-V compound semiconductor comprises InGaAs.

8. The method of claim 5, wherein the first In-V compound semiconductor has a p-type carrier concentration lower than about $1E17/cm^3$.

9. The method of claim 5 further comprising:
forming Shallow Trench Isolation (STI) regions in a semiconductor substrate;
removing a portion of the semiconductor substrate between two opposite portions of the STI regions to form a recess, wherein the first In-V compound semiconductor is grown in the recess; and
recessing the STI regions, wherein a portion of the first In-V compound semiconductor over the STI regions form a fin, and wherein the second In-V compound semiconductor is grown on the fin.

10. The method of claim 5, wherein the donor impurity comprises silicon, and wherein in the epitaxially growing the second In-V compound semiconductor, the silicon is supplied through a precursor comprising $SiH_4$ or $Si_2H_6$.

11. The method of claim 5, wherein the donor impurity comprises germanium, and wherein in the epitaxially growing the second In-V compound semiconductor, silicon is supplied through a precursor comprising $GeH_4$ or $Ge_2H_6$.

12. The method of claim 5 further comprising:
forming Shallow Trench Isolation (STI) regions in a semiconductor substrate;
removing a portion of the semiconductor substrate between two opposite portions of the STI regions to form a recess, wherein the first In-V compound semiconductor is grown in the recess; and
recessing the STI regions, wherein a portion of the first In-V compound semiconductor over the STI regions forms a fin, and wherein the second In-V compound semiconductor is grown on the fin.

13. The method of claim 5, wherein the donor impurity comprises germanium, tin, selenium, or tellurium.

14. A method comprising:
epitaxially growing a first III-V compound semiconductor, wherein the first III-V compound semiconductor is of p-type, and wherein the epitaxially growing the first III-V compound semiconductor is performed using precursors comprising:
a first precursor comprising bis cyclopentadienyl magnesium (Cp2Mg); and
a second precursor comprising a donor impurity;
epitaxially growing a second III-V compound semiconductor overlying and contacting the first III-V compound semiconductor, wherein the second III-V compound semiconductor is of n-type;
forming a gate dielectric over the second III-V compound semiconductor;
forming a gate electrode over the gate dielectric; and
forming a source region and a drain region connected to opposite ends of the second IIIV compound semiconductor, wherein the source region and the drain region are of n-type.

15. The method of claim 14, wherein during the epitaxially growing the second III-V compound semiconductor, no donor impurity that turns the second III-V compound semiconductor toward n-type is used.

16. The method of claim 14, wherein during the epitaxially growing the second III-V compound semiconductor, no Cp2Mg is used.

17. The method of claim 14 further comprising:
forming Shallow Trench Isolation (STI) regions in a semiconductor substrate;
removing a portion of the semiconductor substrate between two opposite portions of the STI regions to form a recess, wherein the first III-V compound semiconductor is grown in the recess; and
recessing the STI regions, wherein a portion of the first III-V compound semiconductor over the STI regions forms a fin, and wherein the second III-V compound semiconductor is grown on the fin.

18. The method of claim 14, wherein the donor impurity comprises silicon, and wherein the second precursor is selected from the group consisting essentially of $SiH_4$, $Si_2H_6$, $GeH_4$, $Ge_2H_6$, and combinations thereof.

19. The method of claim 14, wherein the epitaxially growing the first III-V compound semiconductor and the epitaxially growing the second III-V compound semiconductor comprise Metal-Organic Chemical Vapor Deposition (MOCVD).

20. The method of claim 14, wherein the donor impurity comprises germanium, tin, selenium, or tellurium.

\* \* \* \* \*

UNITED STATES PATENT AND TRADEMARK OFFICE
CERTIFICATE OF CORRECTION

PATENT NO. : 9,224,815 B2  Page 1 of 1
APPLICATION NO. : 14/147349
DATED : December 29, 2015
INVENTOR(S) : Meng-Ku Chen It is certified that error appears in the above-identified patent and that said Letters Patent is hereby corrected as shown below:

In the Claims:

In Col. 8, line 41, claim 14, delete "second IIIV compound" and insert --second III-V compound--.

Signed and Sealed this
Twenty-third Day of August, 2016

Michelle K. Lee
*Director of the United States Patent and Trademark Office*